(12) United States Patent
Shi et al.

(10) Patent No.: US 11,979,121 B2
(45) Date of Patent: May 7, 2024

(54) SENSE AMPLIFIER CIRCUIT AND FLIP-FLOP

(71) Applicant: CHANGXIN MEMORY TECHNOLOGIES, INC., Hefei (CN)

(72) Inventors: Dandan Shi, Hefei (CN); Qifan Gong, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 18/152,334

(22) Filed: Jan. 10, 2023

(65) Prior Publication Data

US 2024/0014789 A1 Jan. 11, 2024

Related U.S. Application Data

(63) Continuation of application No. PCT/CN2022/117319, filed on Sep. 6, 2022, and a
(Continued)

(30) Foreign Application Priority Data

Jul. 11, 2022 (CN) .......................... 202210813423.X

(51) Int. Cl.
*H03F 3/45* (2006.01)
*H03K 3/037* (2006.01)

(52) U.S. Cl.
CPC ....... *H03F 3/45251* (2013.01); *H03K 3/0372* (2013.01)

(58) Field of Classification Search
CPC .............. H03F 3/45251; H03K 3/0372; H03K 3/0375; G11C 7/065; G11C 7/106; G11C 7/1048; G11C 7/1087
See application file for complete search history.

(56) References Cited

U.S. PATENT DOCUMENTS 6,118,829 A * 9/2000 North ...................... H03F 3/087
375/345
11,120,846 B2 9/2021 Kim et al.
(Continued)

FOREIGN PATENT DOCUMENTS

| CN | 108233896 A | 6/2018 |
| CN | 111092612 A | 5/2020 |
| CN | 114583925 A | 6/2022 |

OTHER PUBLICATIONS

International Search Report cited in PCT/CN2022/117319 dated Mar. 14, 2023, 7 pages.

*Primary Examiner* — Jung Kim
(74) *Attorney, Agent, or Firm* — Cooper Legal Group, LLC

(57) ABSTRACT

A sense amplifier circuit includes: a charge module configured to charge a set signal node and a reset signal node according to a clock signal; and a sense module configured to sense and amplify a differential input signal according to the clock signal; where, the sense module includes a first amplification circuit, a second amplification circuit, and a cross hopping transfer circuit cross-connected between the first amplification circuit and the second amplification circuit. The cross hopping transfer circuit is configured to transfer a valid signal of a newly started amplification circuit to another amplification circuit if sensing is completed and the differential input signal hops, such that a set signal/reset signal remains unchanged. A flip-flop includes the sense amplifier circuit.

15 Claims, 6 Drawing Sheets

Related U.S. Application Data continuation of application No. PCT/CN2022/017319, filed on Sep. 6, 2022.

(56) References Cited

U.S. PATENT DOCUMENTS

2004/0008068 A1  1/2004  Kim
2015/0311875 A1  10/2015 Chen et al.

* cited by examiner

SENSE AMPLIFIER CIRCUIT AND FLIP-FLOP

CROSS-REFERENCE TO RELATED APPLICATIONS

This is a continuation of International Application No. PCT/CN2022/117319, filed on Sep. 6, 2022, which is based on and claims the priority to Chinese Patent Application No. 202210813423.X, titled "SENSE AMPLIFIER CIRCUIT AND FLIP-FLOP" and filed on Jul. 11, 2022. The entire contents of International Application No. PCT/CN2022/117319 and Chinese Patent Application No. 202210813423.X are incorporated herein by reference.

TECHNICAL FIELD

The present disclosure relates to, but is not limited to, a sense amplifier circuit and a flip-flop.

BACKGROUND

A flip-flop (FF) is one of basic logic unit circuits that constitute a digital system, such as a high-speed circuit system. A flip-flop (FF) is one of basic logic unit circuits that constitute a digital system. The flip-flop has a flip-flop characteristic, and can be switched between two stable states under the action of an input signal. The performance of the flip-flop has an important influence on the performance of digital systems, especially a high-speed digital system.

There are various types of existing flip-flops, having their own unique features.

A transmission gate flip-flop (TGFF) is a kind of master-slave dual-phase clock flip-flops, which includes a low-level-sensitive master-level latch and a high-level-sensitive slave-level latch. If the setup time is not enough, data cannot be stably latched by the flip-flop on a rising edge of a clock signal CLK.

A pulse triggered flip-flop (PTFF) better improves the disadvantage of more setup time of the TGFF, but needs an extra circuit to generate a clock tree, which increases power consumption and area overhead.

A semi-dynamic flip-flop (SDFF) has a short D-Q delay, but does not have a capability to tolerate clock skew and time borrowing.

A sense amplifier-based flip-flop includes a master level of a fast differential sense amplifier and a slave level of an SR latch. It has a small setup time and hold time, and is relatively immune to the above problems, and is a solution suitable for low supply voltages. The differential sense amplifier in the prior art has the problem that there are many charge/discharge nodes, which easily leads to data acquisition errors.

Therefore, there is an urgent need for a flip-flop having high sensitivity, high stability and low power consumption.

SUMMARY

An overview of the subject described in detail in the present disclosure is provided below. This overview is not intended to limit the protection scope of the claims.

The present disclosure provides a sense amplifier circuit and a flip-flop.

A first aspect of the present disclosure provides a sense amplifier circuit, including:

a charge module configured to charge a set signal node and a reset signal node according to a clock signal; and a sense module coupled to the charge module and configured to sense and amplify a differential input signal according to the clock signal; where, the sense module includes a first amplification circuit, a second amplification circuit, and a cross hopping transfer circuit cross-connected between the first amplification circuit and the second amplification circuit; the cross hopping transfer circuit includes a first transfer circuit and a second transfer circuit; the first transfer circuit is configured to transfer a valid signal of the second amplification circuit to the first amplification circuit if sensing is completed and first hopping of the differential input signal occurs, such that a set signal of the set signal node and a reset signal of the reset signal node remain unchanged; and the second transfer circuit is configured to transfer a valid signal of the first amplification circuit to the second amplification circuit if the sensing is completed and second hopping of the differential input signal occurs, such that the set signal of the set signal node and the reset signal of the reset signal node remain unchanged.

A second aspect of the present disclosure provides a flip-flop, including:

the sense amplifier circuit according to the first aspect above; and a latch configured to receive the clock signal, the differential input signal, and the set signal from the sense amplifier circuit and latch a target data signal.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

DETAILED DESCRIPTION

Figure 1:
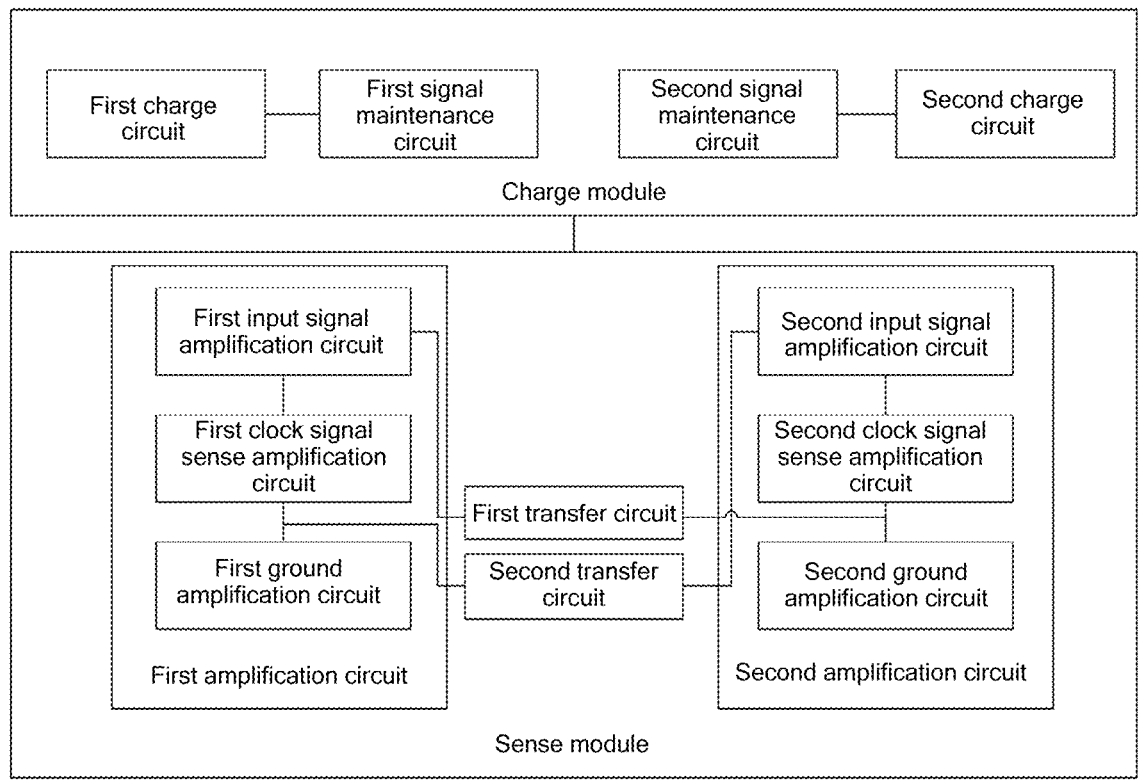
FIG. 1 is a schematic diagram of an overall structure of a sense amplifier circuit according to one embodiment of the present disclosure.

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Embodiments of the present disclosure provide a sense amplifier circuit, including a charge module and a sense module. The charge module is configured to charge a set signal node and a reset signal node according to a clock signal. The sense module is coupled to the charge module, and is configured to sense and amplify a differential input signal according to the clock signal. The sense module includes a first amplification circuit, a second amplification circuit, and a cross hopping transfer circuit cross-connected between the first amplification circuit and the second amplification circuit. The cross hopping transfer circuit includes a first transfer circuit and a second transfer circuit. The first transfer circuit is configured to transfer a valid signal of the second amplification circuit to the first amplification circuit if sensing is completed and first hopping of the differential input signal occurs, such that a set signal of the set signal node and a reset signal of the reset signal node remain unchanged. The set signal of the set signal node is continuously discharged through a pull-down path in a sensing stage, and the reset signal of the reset signal node is continuously charged through a pull-up path of the charge module. The second transfer circuit is configured to transfer a valid signal of the first amplification circuit to the second amplification circuit if the sensing is completed and second hopping of the differential input signal occurs, such that the set signal of the set signal node and the reset signal of the reset signal node remain unchanged. The reset signal of the reset signal node is continuously discharged through the pull-down path in the sensing stage, and the set signal of the set signal node is continuously charged through the pull-up path of the charge module. The charge module and the sense module are connected through the set signal node and the reset signal node.

For example, the first hopping refers to the hopping of an original data signal of the differential input signal from a valid signal (such as a high level) to an invalid signal (such as a low level). The second hopping refers to the hopping of an inverted data signal of the differential input signal from the valid signal to the invalid signal. The original data signal and the inverted data signal are a group of complementary signals.

For example, the sense amplifier circuit according to the embodiments of the present disclosure is implemented as a single-ended high-speed low-power consumption sense amplifier (SA), specifically an improved N-metal-oxide-semiconductor (NMOS) sense amplifier. The module structure of the sense amplifier circuit and the corresponding operating process are described in detail below.

Figure 2A:
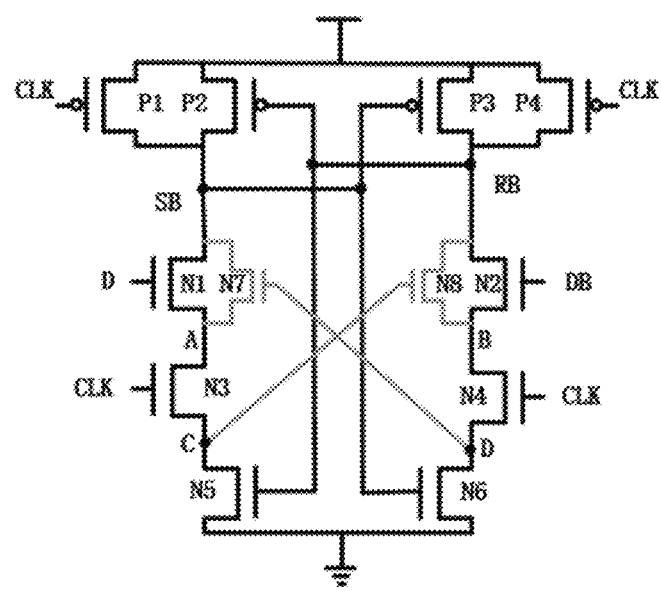
FIG. 2A is a schematic diagram of a circuit structure of a sense amplifier circuit according to one embodiment of the present disclosure.

As shown in FIG. 1 and FIG. 2A, the charge module of the sense amplifier circuit includes a first charge circuit configured to charge the set signal node according to the clock signal (CLK), and a second charge circuit configured to charge the reset signal node according to the clock signal (CLK).

The charge module further includes a first signal maintenance circuit and a second signal maintenance circuit. The first signal maintenance circuit is connected in parallel to the first charge circuit, is connected to the reset signal node, and is configured to maintain the state of the set signal if the sensing is completed and the first hopping of the differential input signal occurs. The second signal maintenance circuit is connected in parallel to the second charge circuit, is connected to the set signal node, and is configured to maintain the state of the reset signal if the sensing is completed and the second hopping of the differential input signal occurs.

As shown in FIG. 1 and FIG. 2A, the sense module includes two amplification circuits coupled symmetrically, which are respectively a first amplification circuit and a second amplification circuit.

The first amplification circuit includes a first input signal amplification circuit and a first clock signal sense amplification circuit connected in series; and the second amplification circuit includes a second input signal amplification circuit and a second clock signal sense amplification circuit connected in series. The second clock signal sense amplification circuit is connected to the first input signal amplification circuit through the first transfer circuit; and the first clock signal sense amplification circuit is connected to the second input signal amplification circuit through the second transfer circuit. The first input signal amplification circuit and the second input signal amplification circuit are configured to receive the differential input signal.

The differential input signal includes the original data signal (signal D) and the inverted data signal (DB), and the inverted data signal is a complementary signal of the original data signal. Without loss of generality, the first input signal amplification circuit is configured to trigger an action in response to the original data signal (signal D). The second input signal amplification circuit is configured to trigger an action in response to the inverted data signal (signal DB, which is an inverted signal of the original data signal). The inverted data signal DB is an inverted signal of the original data signal D. For example, if the original data signal is a high-level signal, the inverted data signal is a low-level signal; and if the original data signal is a low-level signal, the inverted data signal is a high-level signal.

In the embodiments of the present disclosure, that the circuit acts in response to a corresponding signal means that a switch device or a switch unit in the circuit is turned on or off in response to a specified electric signal. For example, if the specified electric signal is a valid signal, the corresponding switch device or switch unit is turned on. For example, a high-level-triggered switch unit or switch device is triggered to be on if a high-level signal is received. Then the high-level signal is a valid signal for the switch unit or switch device.

The first amplification circuit further includes a first ground amplification circuit. The first input signal amplification circuit, the first clock signal sense amplification circuit, and the first ground amplification circuit are sequentially connected in series, a first terminal of the first input signal amplification circuit is connected to the set signal node, a second terminal of the first input signal amplification circuit is connected to a first terminal of the first clock signal sense amplification circuit, a second terminal of the first clock signal sense amplification circuit is connected to a first terminal of the first ground amplification circuit, and the second terminal of the first ground amplification circuit is grounded. The first ground amplification circuit is connected to the reset signal node and turned on or turned off under an action of the reset signal. The second amplification circuit further includes a second ground amplification circuit. The second input signal amplification circuit, the second clock signal sense amplification circuit, and the second ground sense amplification circuit are sequentially connected in series. A first terminal of the second input signal amplification circuit is connected to the reset signal node, the second terminal of the second input signal amplification circuit is connected to a first terminal of the second clock signal sense amplification circuit, a second terminal of the second clock signal sense amplification circuit is connected to the first terminal of the second ground amplification circuit, a second terminal of the second ground amplification circuit is grounded, and a control terminal of the second ground amplification circuit is connected to the set signal node and turned on or turned off under an action of the set signal.

The first amplification circuit is configured to receive the original data signal, and is turned on in the sensing stage for pulling the set signal down to a low level through the first pull-down path. The second amplification circuit is configured to receive the inverted data signal, and is turned on in the sensing stage for pulling the reset signal down to a low level through a second pull-down path.

The first charge circuit, the first input signal amplification circuit, the first clock signal sense amplification circuit, and the first ground amplification circuit are sequentially connected in series. The second charge circuit, the second input signal amplification circuit, the second clock signal sense amplification circuit, and the second ground amplification circuit are sequentially connected in series.

In the embodiments of the present disclosure, a cross hopping transfer branch can always be discharged (pulled down) through an original pull-down path during the hopping process of the set signal or the reset signal, such that the efficiency is high, the power consumption is low, and wrong outputs caused by the hopping of the differential input signal can be avoided.

The completion of the sensing stage means that if the original data signal is at a high level, the set signal has been pulled down to a low level, namely a logic "0" signal, and the reset signal has been pulled up to a high level, namely a logic "1" signal. Or, if the original data signal is at a low level, the set signal has been pulled up to a high level, namely a logic "1" signal, and the reset signal has been pulled down to a low level, namely a logic "0" signal.

The first pull-down path and the second pull-down path are described in detail below.

The first input signal amplification circuit and the first clock signal sense amplification circuit are connected through a first node (node A). The second input signal amplification circuit and the second clock signal sense amplification circuit are connected through a second node (node B). The first clock signal sense amplification circuit and the first ground amplification circuit are connected through a third node (node C). The second clock signal sense amplification circuit and the second ground amplification circuit are connected through a fourth node (node D).

The first charge circuit and the first terminal of the second charge circuit are both connected to the power supply; the second terminal of the first charge circuit and the sense module are connected through the set signal node; and the second terminal of the second charge circuit and the sense module are connected through the reset signal node. For example, the first charge circuit and the first input signal amplification circuit are connected through the set signal node (an SB node configured to acquire the set signal); and the second charge circuit and the second input signal amplification circuit are connected through the reset signal node (an RB node configured to acquire the reset signal).

The first ground amplification circuit and the second ground amplification circuit are both grounded through a ground point.

If the set signal node, the first node, the third node, and the ground point are connected, the first pull-down path for pulling down the set signal is formed; and if the reset signal node, the second node, the fourth node, and the ground point are connected, the second pull-down path for pulling down the reset signal is formed.

The first clock signal sense amplification circuit and the second clock signal sense amplification circuit are respectively configured to receive the clock signal and turned on if the clock signal is at a high level. The first ground amplification circuit and the second ground amplification circuit are both high-level trigger circuits, i.e., triggering an action if a high level is acquired.

The trigger action in the embodiments of the present disclosure includes turning on the switch device (or switch unit) in the circuit.

The operating principle of the sense module is described below.

The cross hopping transfer circuit is configured to transfer a valid signal in the amplification circuit that is turned on when the differential input signal hops after the sensing stage is completed, to another amplification circuit that is turned on before the differential input signal hops (sensing stage). When the differential input signal hops, the amplification circuit (the first amplification circuit or the second amplification circuit) that is turned on during the sensing stage will be temporarily disconnected, while the other amplification circuit is triggered and turned on when the differential input signal hops. At this time, the amplification circuit that is turned on in the sensing stage can be turned on again through the cross hopping transfer branch, such that the pull-down of the signal (set signal or reset signal) can be continued through the original pull-down path in the sensing stage.

The first transfer circuit is connected in parallel to the first input signal amplification circuit, a first terminal of the first transfer circuit and a first terminal of the first input signal amplification circuit are both connected to the set signal node, a second terminal of the first transfer circuit and a second terminal of the first input signal amplification circuit are both connected to a first terminal of the first clock signal sense amplification circuit, and a control terminal of the first transfer circuit is connected to a second terminal of the second clock signal sense amplification circuit; and the second transfer circuit is connected in parallel to the second input signal amplification circuit, a first terminal of the second transfer circuit and a first terminal of the second input signal amplification circuit are both connected to the reset signal node, a second terminal of the second transfer circuit and a second terminal of the second input signal amplification circuit are both connected to a first terminal of the second clock signal sense amplification circuit, and a control terminal of the second transfer circuit is connected to a second terminal of the first clock signal sense amplification circuit.

For example, the first transfer circuit is configured to transfer the valid signal of the second amplification circuit to the first amplification circuit if the sensing is completed and the differential input signal hops, such that the set signal is continuously discharged through the pull-down path in the sensing stage. (In the sensing stage, if the original data signal is at a high level, the set signal is discharged through the first pull-down path of the first amplification circuit, i.e., pulled down) The second transfer circuit is configured to transfer the valid signal of the first amplification circuit to the second amplification circuit if the sensing is completed and the differential input signal hops, such that the reset signal is continuously amplified through the pull-down path in the sensing stage (in the sensing stage, if the original data signal is at a low level, the reset signal is discharged through the second pull-down path of the second amplification circuit, i.e., pulled down).

The cross hopping transfer circuit enables the differential input signal (such as the original data signal) to still be discharged through the pull-down path in the data signal sensing stage when the differential input signal hops after the sensing stage is completed. The pull-down speed is fast, the hopping interference of the differential input signal is avoided, and the safety and efficiency are high.

The respective circuits constituting the charge module are exemplarily described below.

The charge module includes a first charge circuit and a first signal maintenance circuit connected in parallel, and a second charge circuit and a second signal maintenance circuit connected in parallel. The first charge circuit includes a first switch unit, and the first signal maintenance circuit includes a second switch unit. The first switch unit is connected in parallel to the second switch unit. The first switch unit is provided with a first terminal connected to the power supply, a second terminal connected to the set signal node, and a control terminal configured to receive the clock signal. The second switch unit is provided with a first terminal connected to the power supply, a second terminal connected to the set signal node, and a control terminal configured to receive the reset signal of the reset signal node. The second charge circuit includes a fourth switch unit, and the second signal maintenance circuit includes a third switch unit. The third switch unit is connected in parallel to the fourth switch unit. The third switch unit is provided with a first terminal connected to the power supply, a second terminal connected to the set signal node, and a control terminal configured to receive the set signal of the set signal node. The fourth switch unit is provided with a first terminal connected to the power supply, a second terminal connected to the set signal node, and a control terminal configured to receive the clock signal.

In the embodiment of the present disclosure, the switch unit (such as the first switch unit or the second switch unit) may select a low-level triggered electronic device. In another embodiment, the switch unit may also be implemented by combining a high-level triggered electronic device with an inverter.

For example, the first charge circuit includes a first P-channel metal oxide semiconductor (PMOS) transistor P1, the first signal maintenance circuit includes a second PMOS transistor P2, the second charge circuit includes a fourth PMOS transistor P4, and the second signal maintenance circuit includes a third PMOS transistor P3. Sources of P1, P2, P3, and P4 are all connected to the power supply. Gates of P1 and P4 are configured to receive the clock signal (CLK). Drains of P1 and P2 are connected to form a first signal node, namely the set signal node. Drains of P3 and P4 are connected to form a second signal node, namely the reset signal node. The drains of P1 and P2, namely the set signal node, are also connected to a gate of P3. The drains of P3 and P4, namely the reset signal node, are also connected to a gate of P2.

The respective circuits constituting the sense module are exemplarily described below.

The first input signal amplification circuit includes a first switch device, and the first transfer circuit includes a seventh switch device. A first terminal of the first switch device and a first terminal of the seventh switch device are both connected to the set signal node, a second terminal of the first switch device and a second terminal of the seventh switch device are both connected to a first terminal (first node) of the first clock signal sense amplification circuit, and a control terminal of the seventh switch device is connected to a second terminal (fourth node) of the second clock signal sense amplification circuit. The second input signal amplification circuit includes a second switch device, and the second transfer circuit includes an eighth switch device. A first terminal of the second switch device and a first terminal of the eighth switch device are both connected to the reset signal node, a second terminal of the second switch device and a second terminal of the eighth switch device are both connected to a first terminal (second node) of the second clock signal sense amplification circuit, a control terminal of the eighth switch device is connected to a second terminal (third node) of the first clock signal sense amplification circuit, a control terminal of the first switch device is configured to receive the original data signal, and a control terminal of the second switch device is configured to receive the inverted data signal.

In the embodiment of the present disclosure, the switch device (such as the first switch device or the seventh switch device) may select a high-level triggered electronic device. In another embodiment, the switch device may also be implemented by combining a low-level triggered electronic device with an inverter. The embodiments of the present disclosure do not limit device selection.

The first clock signal sense amplification circuit includes a third switch device, provided with a first terminal connected to a second terminal (first node) of the first switch device, a second terminal connected to a first terminal (third node) of the first ground amplification circuit, and a control terminal configured to receive the clock signal. The second clock signal sense amplification circuit includes a fourth switch device, provided with a first terminal connected to a second terminal (second node) of the second switch device, a second terminal connected to a first terminal (fourth node) of the second ground amplification circuit, and a control terminal configured to receive the clock signal.

For example, the first clock signal sense amplification circuit includes a third N-channel metal oxide semiconductor (NMOS) transistor N3. A gate of N3 is configured to receive the clock signal, and is turned on if the clock signal is at a high level. A drain of N3 is connected to the first node (node A). For example, the drain of N3 is connected to a source of N1 to form the first node (node A). A source of N3 is connected to the third node (node C). The second clock signal sense amplification circuit includes a fourth NMOS transistor N4. A gate of N4 is configured to receive the clock signal, and is turned on if the clock signal is at a high level. A drain of N4 is connected to the second node (node B). For example, the drain of N4 is connected to a source of N2 to form the second node (node B). A source of N4 is connected to the fourth node (node D).

The first input signal amplification circuit includes a first NMOS transistor N1, and the first transfer circuit includes a seventh NMOS transistor N7. A gate of N1 is configured to receive the original data signal (D). A drain of N1 is connected to the drain of P1 (and P2), namely the set signal node. A source of N1 is connected to the first node (node A). N7 is provided with a drain connected to the drain of N1 and a source connected to the source of N1. The second input signal amplification circuit includes a second NMOS transistor N2, and the second transfer circuit includes an eighth NMOS transistor N8. A gate of N2 is configured to receive the inverted data signal DB. A drain of N2 is connected to the drain of P3 (and P4), namely the reset signal node. A source of N2 is connected to the second node (node B). N8 is provided with a drain connected to the drain of N2 and a source connected to the source of N2. A gate of N7 is connected to the source of N4. A gate of N8 is connected to the source of N3.

The first ground amplification circuit includes a fifth switch device, provided with a first terminal connected to a second terminal (third node) of the third switch device, a second terminal grounded, and a control terminal configured to receive the reset signal of the reset signal node. The second ground amplification circuit includes a sixth switch device, provided with a first terminal connected to a second terminal (third node) of the fourth switch device, a second terminal grounded, and a control terminal configured to receive the set signal of the set signal node.

For example, the first ground amplification circuit includes a fifth NMOS transistor N5. A gate of N5 is connected to the reset signal node (RB). A drain of N5 is connected to the third node (node C). A source of N5 is grounded. The second ground amplification circuit includes a sixth NMOS transistor N6. A gate of N6 is connected to the set signal node (SB). A drain of N6 is connected to the fourth node (node C). A source of N6 is grounded.

As shown in FIG. 2A, when CLK is at a low level, only nodes RB, SB, and A (or B) are charged, which greatly reduces the waste of charging and discharging other node circuits. At the same time, the improved SA can capture input data faster on a rising edge of CLK. This is mainly due to the fact that an internal node (node on the pull-down path) remains at a low level during the discharge process, which reduces the discharge time of the internal node, resulting in better retention time and lower power consumption.

The embodiments of the present disclosure further provide a sense amplifier circuit-based flip-flop, which samples data on a rising edge of the clock signal by using the above improved sense amplifier primary flip-flop, then latches the data through a latch, and is applied to sample the data on a rising edge of a high-speed circuit system. The latch is configured to receive the clock signal, the differential input signal, and the set signal from the sense amplifier circuit and latch a target data signal.

The structure of the latch in the embodiments of the present disclosure is exemplarily described below.

Figure 2B:
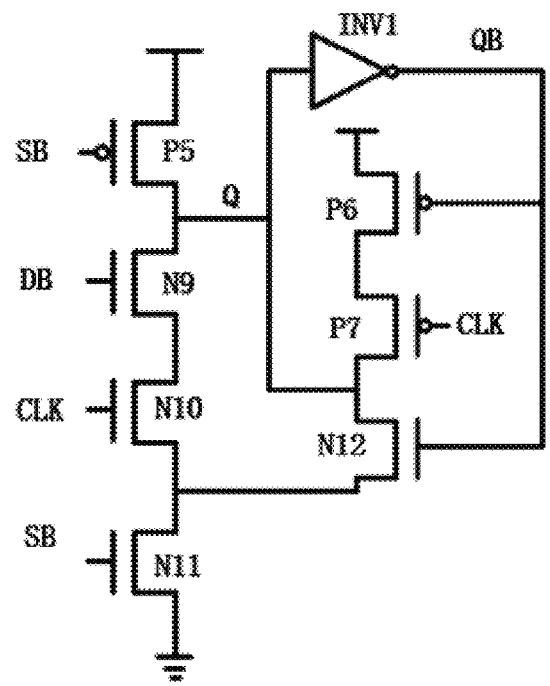
FIG. 2B is a schematic diagram of a circuit structure of a secondary level of a flip-flop according to one embodiment of the present disclosure.

As shown in FIG. 2B, the secondary latch is an SR latch, including a charge/discharge circuit and a feedback circuit. The charge/discharge circuit is coupled to the feedback circuit. The charge/discharge circuit is configured to receive the clock signal, the differential input signal, and the set signal, and output the target data signal. The feedback circuit is configured to receive the target data signal and the clock signal, and latch the target data signal if the clock signal is invalid.

The charge/discharge circuit includes a fifth switch unit, a ninth switch device, a tenth switch device, and an eleventh switch device sequentially connected in series. The fifth switch unit is provided with a first terminal connected to the power supply, a second terminal connected to a first terminal of the ninth switch device, and a control terminal configured to receive the set signal. The differential input signal includes an original data signal and an inverted data signal. The ninth switch device is provided with a control terminal configured to receive the inverted data signal and a second terminal connected to a first terminal of the tenth switch device. The tenth switch device is provided with a control terminal configured to receive the clock signal and a second terminal connected to a first terminal of the eleventh switch device. The eleventh switch device is provided with a second terminal grounded and a control terminal configured to receive the set signal. The second terminal of the fifth switch unit is configured to output the target data signal. The fifth switch unit and the eleventh switch device are configured such that both cannot be turned on at the same time, that is, at most one of both is turned on at a same time.

For example, the charge/discharge circuit includes a fifth PMOS transistor P5, a ninth NMOS transistor N9, a tenth NMOS transistor N10, and an eleventh NMOS transistor N11 sequentially connected in series. P5 is provided with a source connected to the power supply, a drain connected to a drain of N9, and a gate configured to receive the set signal (SB). N9 is provided with a source connected to a drain of N10 and a gate configured to acquire the inverted data signal (DB). N10 is provided with a source connected to a drain of N11 and a gate configured to acquire the clock signal (CLK). N11 is provided with a source grounded and a gate configured to acquire the set signal (SB). A connecting point between the drain of P5 and the drain of N9 serves as an output sampling point for acquiring the target data signal Q.

The feedback circuit includes a sixth switch unit, a seventh switch unit, a twelfth switch device, and an inverter sequentially connected in series. The sixth switch unit is provided with a first terminal connected to the power supply and a second terminal connected to a first terminal of the seventh switch unit. The inverter is provided with an input terminal for receiving the target data signal and an output terminal connected to a control terminal of the sixth switch unit for outputting an inverted signal of the target data signal. The seventh switch unit is provided with a second terminal connected to a first terminal of the twelfth switch device and a control terminal configured to receive the clock signal. The twelfth switch device is provided with a second terminal connected to a second terminal of the tenth switch device and a control terminal connected to an output terminal of the inverter. The second terminal of the seventh switch unit is connected to the first terminal of the twelfth switch device. The sixth switch unit and the twelfth switch device are configured such that both cannot be turned on at the same time, that is, at most one of both is turned on at a same time.

For example, the feedback circuit includes a sixth PMOS transistor P6, a seventh PMOS transistor P7, and a twelfth NMOS transistor N12. P6 is provided with a source connected to the power supply and a drain connected to a source of P7. A gate of P6 is connected to the charge/discharge circuit through the inverter. For example, the inverter (INV1) is provided with an input terminal connected to the output sampling point and an output terminal connected to the gate of P6. P7 is provided with a drain connected to a drain of N12 and a gate configured to receive the clock signal (CLK). N12 is provided with the source connected to a source of N10 and a gate connected to the output terminal of the inverter. The output terminal of the inverter is configured to output the inverted signal of the target data signal Q. A sixth node is formed at the junction of P7 and N12, and is connected to the output sampling point.

The positions of transistors controlled by DB and CLK are exchanged in the secondary latch, which avoids the charging and discharging of the node between the two transistors, and further optimizes the power consumption.

The operating process of the primary sense amplifier is exemplarily described below.

In the charging stage: if the clock signal is at a low level, the set signal node and the reset signal node are charged to a high level (1), and the cross hopping transfer circuit is discharged to a low level (0). As shown in FIG. 2A, if CLK is 0, P1 and P4 are turned on, and the set signal node (SB) and the reset signal node (RB) are charged to a high level, namely 1; N5 and N6 are turned on, nodes C and D are discharged to 0, and N7 and N8 are turned off.

In the sensing stage: if the sense amplifier acquires to the rising edge of the clock signal, that is, if the clock signal hops from a low level to a high level, the sensing stage is switched to. At this time, if the original data signal is at a high level, the set signal (SB) is pulled down to a low level through the first amplification circuit. For example, the set signal (SB) is pulled down to a low level through the first pull-down path.

Figure 3A:
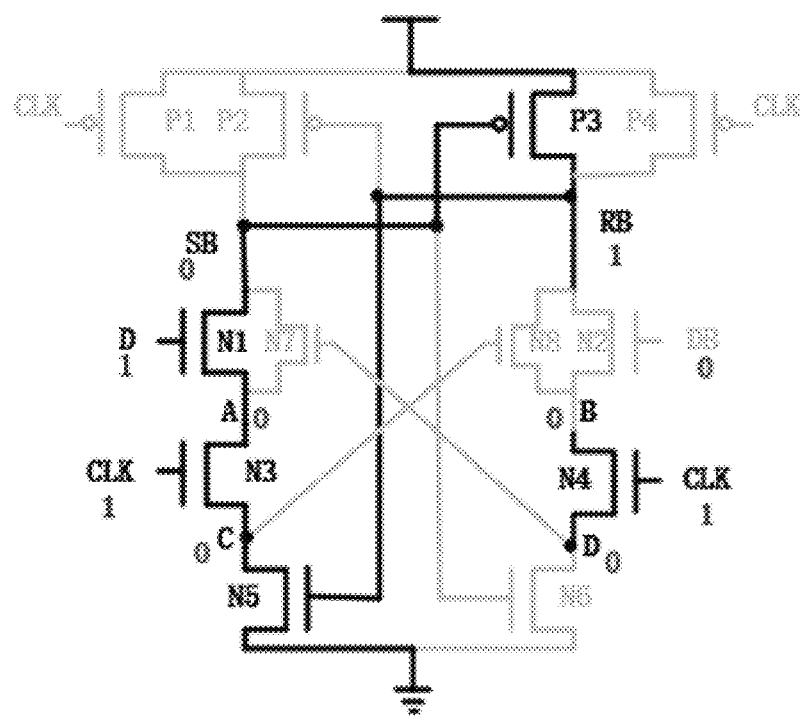
FIG. 3A is a schematic diagram of a current path in a sensing stage of a sense amplifier circuit according to one embodiment of the present disclosure.

The first pull-down path is a signal path from the set signal node, the first node, and the third node to the ground point. As shown in FIG. 3A, the first pull-down path is formed by the first input signal amplification circuit, the first clock signal sense amplification circuit, and the first ground amplification circuit in the first amplification circuit.

As shown in FIG. 3A, if D is 1, the SB node (namely the set signal node) is pulled down to 0 by N1, N3, and N5, then P3 is turned on, and RB remains the original 1.

In the hopping stage: after the sensing stage, if the clock signal is continuously at a high level and the data signal hops to a low level, the first pull-down path is temporarily disconnected, the second amplification circuit is partially turned on (including the second input signal amplification circuit and the second clock signal sense amplification circuit) to form a valid signal, and the valid signal is transferred to the first amplification circuit by the first transfer circuit to turn on the first pull-down path again. The set signal is continuously discharged through the first pull-down path with a low potential, and the discharge speed is fast.

Figure 3B:
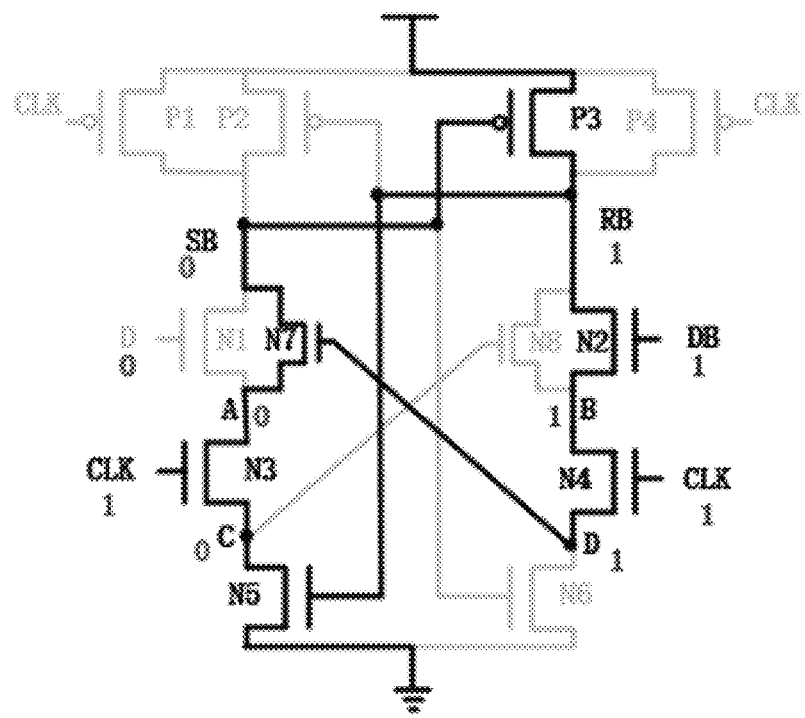
FIG. 3B is a schematic diagram of a current path in a hopping stage of a sense amplifier circuit according to one embodiment of the present disclosure.

As shown in FIG. 3B, after the sensing is completed, if CLK is still high, D suddenly hops to 0. At this time, N2 and N4 are turned on, and node D is charged to 1, such that N7 is turned on. The pull-down paths of the SB node are N7, N3, and N5.

The startup process of N8 is the same. In another scenario, the charging stage is consistent with the above. When the data signal in the sensing stage is at a low level, the circuit operation is symmetrical with the above process, as follows.

In the sensing stage: if the sense amplifier acquires to the rising edge of the clock signal, that is, if the clock signal hops from a low level to a high level, the sensing stage is switched to. At this time, if the original data signal is at a low level, the reset signal (SB) is pulled down to a low level through the second amplification circuit. For example, the reset signal (SB) is pulled down to a low level through the second pull-down path.

The second pull-down path is a signal path from the reset signal node, the second node, and the fourth node to the ground point. The second pull-down path is formed by the second input signal amplification circuit, the second clock signal sense amplification circuit, and the second ground amplification circuit in the second amplification circuit.

For example, if the original data signal D is 0, the inverted data signal DB is 1, the RB node (namely the reset signal node) is pulled down to 0 by N2, N4, and N6, then P2 is turned on, and SB remains the original 1.

After the sensing stage, if the clock signal is continuously at a high level and the original data signal hops to a high level (correspondingly, the inverted data signal hops to a low-level invalid signal), the second pull-down path is temporarily disconnected, the first amplification circuit is partially turned on (including the first input signal amplification circuit and the first clock signal sense amplification circuit) to form a valid signal, and the valid signal is transferred to the second amplification circuit by the second transfer circuit to turn on the second pull-down path again. The reset signal is continuously discharged through the second pull-down path with a low potential, and the discharge speed is fast.

After the sensing is completed, if CLK is still high, D suddenly hops to 1. At this time, N1 and N3 are turned on, and node C is charged to 1, such that N8 is turned on. The pull-down paths of the RB node are N8, N4, and N6.

The flip-flop implemented by the sense amplifier in the embodiments of the present disclosure can reduce the power consumption, and have faster data capture speed and higher accuracy.

As shown in FIG. 2B, if the flip-flop acquires the rising edge of the clock signal (CLK), if the original data signal is 1, the set signal (SB) is pulled down to a low level (0), P5 is turned on, and Q is pulled up to a high level. At this time, if the inverted data signal (DB) is 0, N9 is turned off, and a connecting node between N9 and N10 cannot be charged, thereby avoiding unnecessary charge/discharge process.

When the primary level acquires the rising edge of the clock signal (CLK), if the original data signal is 0, the inverted data signal (DB) is 1, and N9 is turned on; the reset signal (RB) is pulled down to a low level, the set signal (SB) remains at a high level, P5 is turned off, and N11 is turned on; when the clock signal is at a high level, N10 is turned on; and Q is pulled down to a low level through N9, N10, and N11.

The feedback circuit can latch the last data if the clock signal is at a low level.

When the clock signal CLK is at a low level, if the target data signal Q is 1, QB=0, P6 and P7 are turned on, and the target data signal remains 1; and if the target data signal Q is 0, QB=1, N12 and N11 are turned on, and the target data signal remains 0.

The flip-flop implemented by the latch in the embodiments of the present disclosure reduces the energy consumption due to the reduction in the number of charge/discharge nodes.

The sense amplifier circuit and flip-flop of the present disclosure can be applied to the high-speed circuit system, to sample the data on the rising edge of the clock.

The following exemplarily takes an amplifier circuit in the prior art as an example to compare and illustrate the technical effects of the sense amplifier circuit in the embodiments of the present disclosure, but does not limit the usage scenarios of the sense amplifier circuit in the embodiments of the present disclosure.

Figure 4:
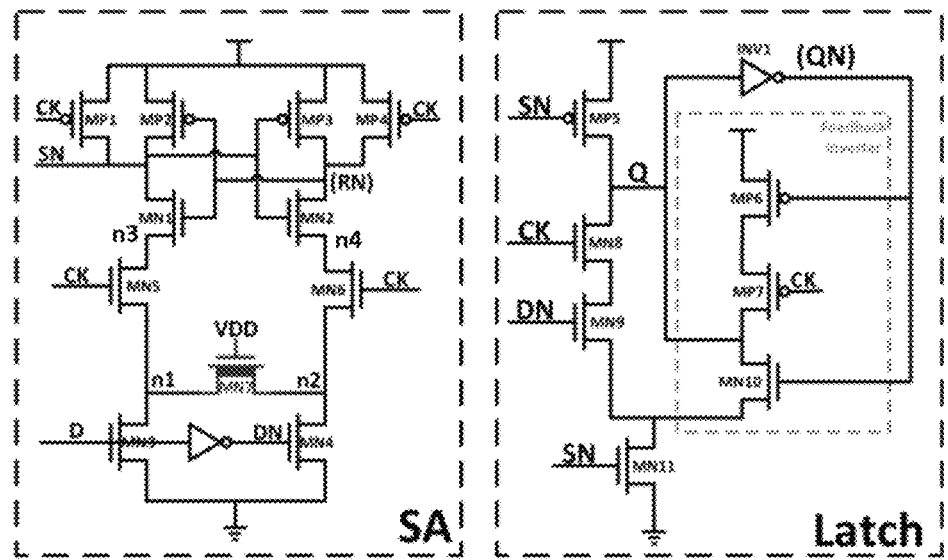
FIG. 4 is a schematic structural diagram of a SAFF according to the prior art.

FIG. 4 is a structural diagram of a sense-amplifier-based flip-flop (SAFF) proposed by Heng You et al. This single-ended SAFF primary differential sense amplifier senses the input data on the rising edge of the clock. Once the clock signal CLK hops from low to high, a sampling window therefor may be closed, and the data is outputted by the secondary level. As shown in FIG. 4, if the primary CLK is at a low level, SN and RN in the circuit are precharged to a high level. When CLK is at a high level, if D is at a high level, SN is discharged to a low level, and output Q is pulled up to 1 by MP5; and if D is at a low level, RN is discharged to a low level, output Q is pulled down to 0 by MN8, MN9, and MN11, and a feedback inverter and INV1 can latch the last data if CLK is at a low level. The SAFF structure mainly has the following problems:

(1) For the primary SA, when CLK is at a low level, it is necessary to charge the SN, RN, n1, n2, n3 and n4 nodes, and then discharge the SN, n3 and n1 nodes or the RN, n4 and n2 nodes on the rising edge of CLK, resulting in higher energy consumption.

(2) When CLK is at a high level, if data D changes from "1" to "0", MN3 is turned off, MN4 is turned on, and the RN, n4 and n2 nodes are discharged. However, since MN7 is a weak transistor that is always turned on, MN4 is turned on to provide a pull-down circuit to ground (MN1, MN5, MN7, MN4) for SN. The MN7 transistor reduces the stability of SAFF under a low power voltage. During the SA stage on the rising edge of CLK, the difference between Vn1 and Vn2 (namely voltages of nodes n1 and n2) should be large enough to obtain RN and SN quickly and correctly.

Figure 5:
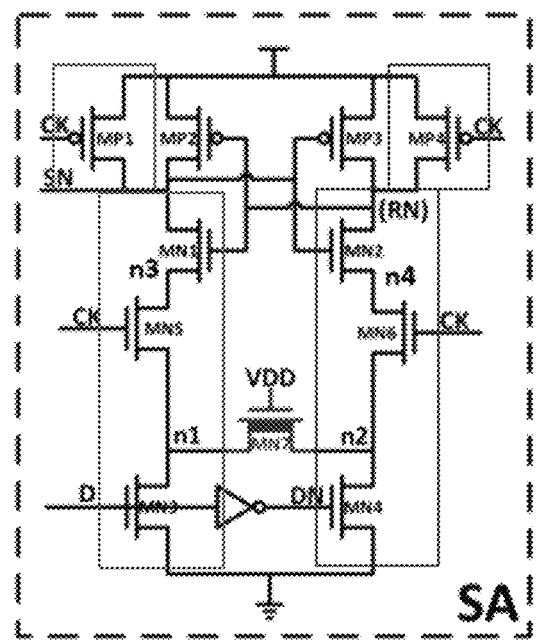
FIG. 5 is a schematic structural diagram of a primary-level fast differential sense amplifier of a SAFF according to the prior art.

As shown in FIG. 5, the primary SA and the differential circuit are asymmetrical structures on both sides, because the secondary level of SAFF only uses the SN signal, and both the pull-up path and the pull-down path of SN in the left box are larger than the transistors in the pull-up path and the pull-down path of RN in the right box, to improve the driving capability of the SN node.

When VDD is low, the difference between Vn1 and Vn2 becomes smaller, the mismatch between the transistors on both sides of the circuit has a serious impact on the difference between Vn1 and Vn2, and wrong data may be latched in the SA stage. If D is 0 and DN is 1, due to the small size of the MN4 transistor, the voltage at the n2 point decreases slowly, and the voltage at the n1 point also decreases slightly through the MN7 transistor. The voltage reduction at the n1 point may cause unnecessary power consumption, and even pull the voltage at the SN point down to 0.

Figure 6:
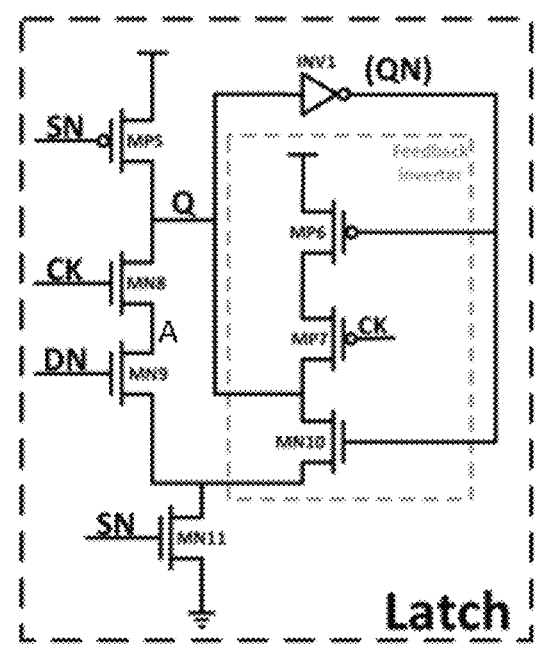
FIG. 6 is a schematic structural diagram of a secondary latch of a SAFF according to the prior art.
Figure 7:
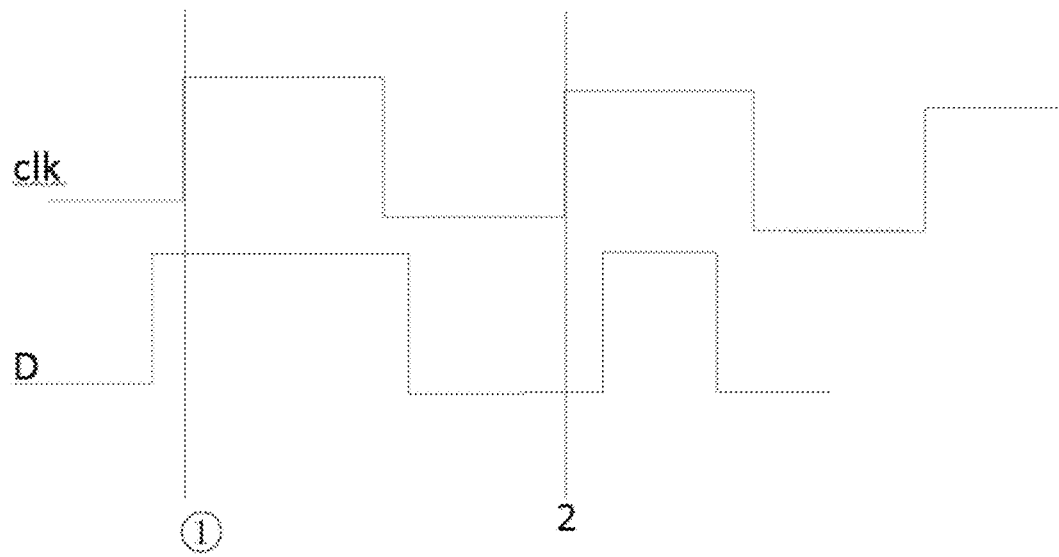
FIG. 7 is a signal waveform diagram of a SAFF according to the prior art.

3) As shown in FIG. 6 and FIG. 7, at the first moment, when D=1 upon arrival of the rising edge of CLK, SN is 0, the MP5 and MN8 transistors are turned on, and the target data signal nodes Q and A may be charged to a high level.

As shown in FIG. 6 and FIG. 7, at the second moment, when D=0 upon arrival of the rising edge of CLK, SN is 1, the MN8, MN9 and MN11 transistors are turned on, and the target data signal nodes Q and A may be charged to a low level. In this way, unnecessary repeated charging and discharging of node A may increase the power consumption.

The flip-flop SAFF in the embodiments of the present disclosure completes the measurement of the delay and power consumption on HSPICE software. The simulation conditions are set as follows: the room temperature is 25 degrees Celsius, a 1.2 V power voltage TT process angle, clock frequency fclk=500 MHz, input data signal frequency fd=250 MHz ($\alpha$=1), $\alpha$ represents a data activity factor, and the calculation formula thereof is $$\alpha = \frac{2fd}{fclk},$$

where fd represents the frequency of the input signal, and fclk represents the frequency of the clock signal.

Figure 8:
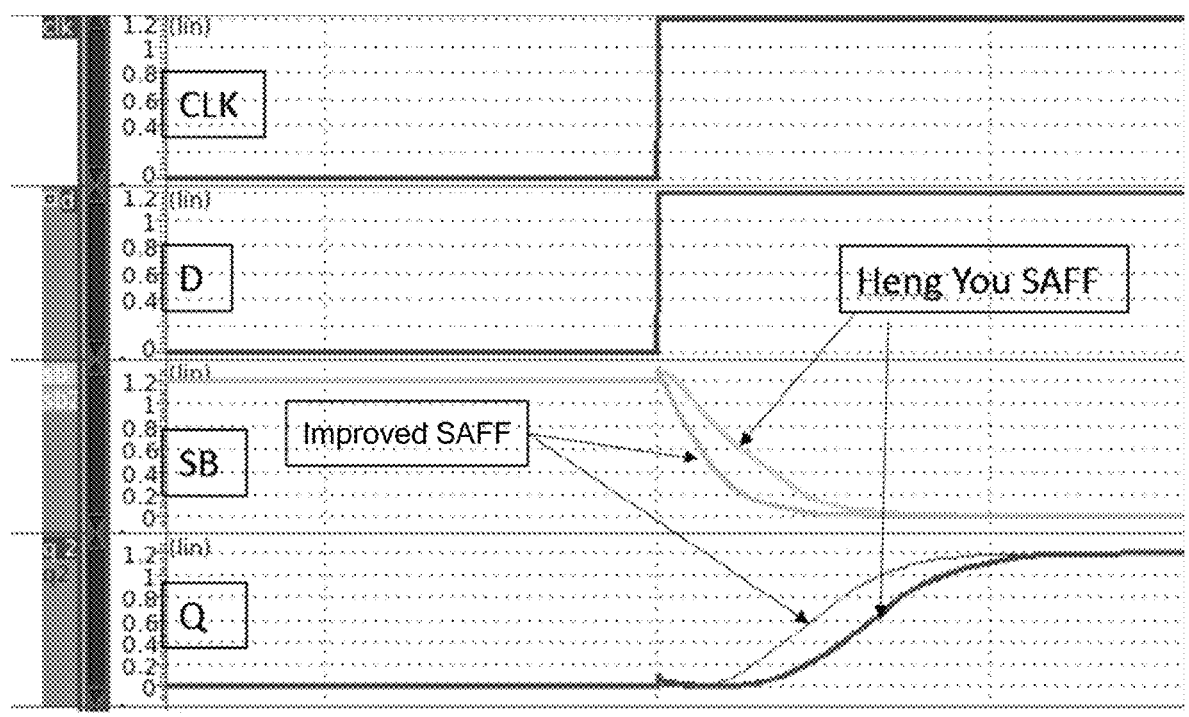
FIG. 8 is schematic diagram of pull-down speed comparison of set signals between a SAFF according to one embodiment of the present disclosure and a SAFF according to the prior art.

Comparing the output waveform of the Heng You SAFF with the output waveform in the simulation diagram of the improved SAFF, it is found that the flip-flop in the embodiments of the present disclosure is faster on the rising and falling edges of the level transition of the signal Q, and consumes less power. As shown in FIG. 8, in the sensing stage SB of the improved SAFF in the embodiments of the present disclosure, the input data can be captured faster on the rising edge of CLK. The improved SAFF has a shorter delay in sensing that the data is pulled down to a low level than the Heng You SAFF, and the sensing delay is optimized by 21.6%.

Figure 9:
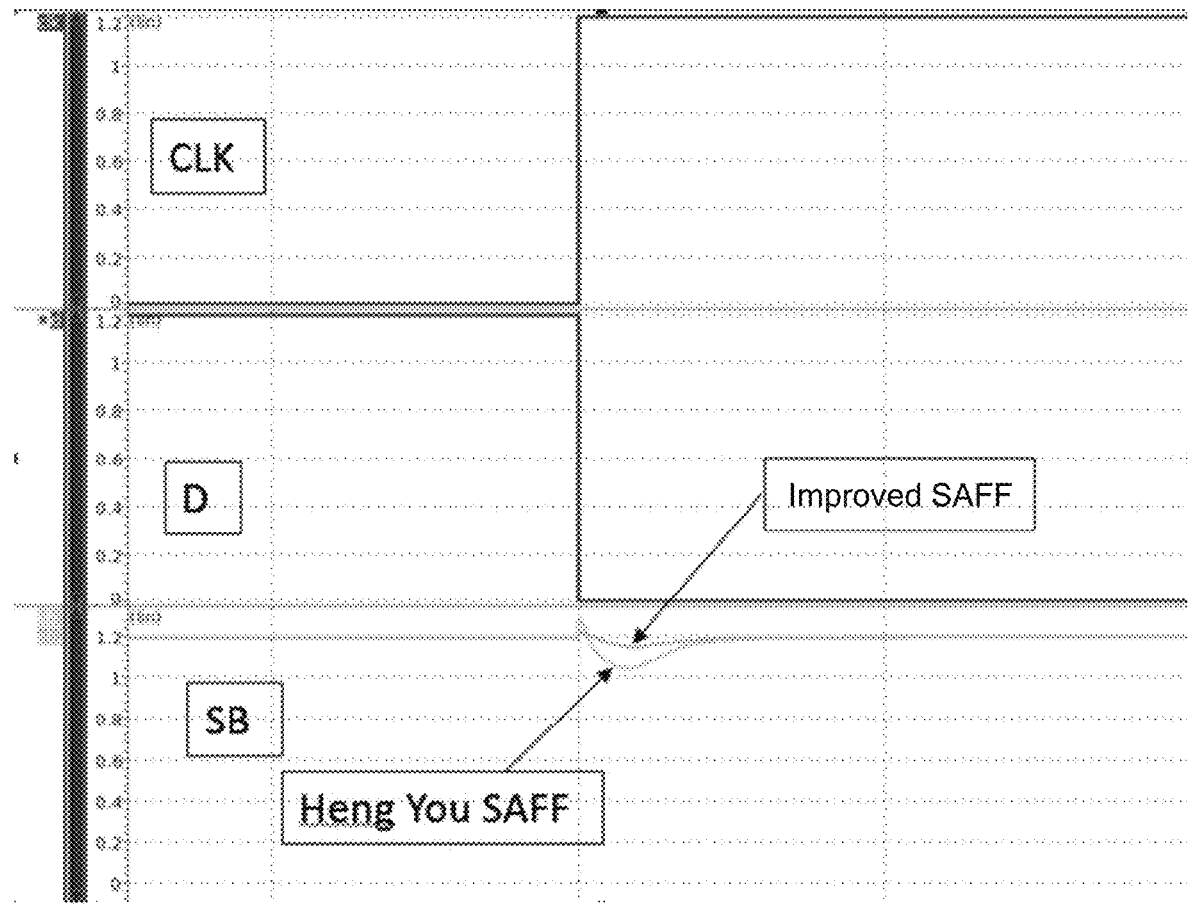
FIG. 9 is schematic diagram of comparison of current mutual interference effects between a SAFF according to one embodiment of the present disclosure and a SAFF according to the prior art.

As shown in FIG. 9, there is no current interference on both sides of the differential pull-down circuit provided in the improved SAFF. The signal that needs to be kept from being pulled down can be stabilized at a high level. Compared with the Heng You SAFF which is affected by an always-on transistor, when the SB pull-down path is not turned on, the SB voltage still drops, and the redundant actions not only waste the power consumption, but even cause SB errors.

The sense amplifier circuit and the flip-flop provided by the present disclosure can avoid mutual interference of currents on both sides of a differential structure, thereby improving the stability and accuracy of amplifier outputs; and when the sense amplifier circuit is applied to the flip-flop, the data sampling is fast, and the energy consumption is low. Moreover, using the optimized latch of the present disclosure can reduce the number of charge/discharge nodes, and further reduce the energy consumption and improve the efficiency.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

The sense amplifier circuit and the flip-flop provided in the embodiments of the present disclosure can avoid mutual interference of currents on both sides of the differential structure, thereby improving the stability and accuracy of amplifier outputs, and when the sense amplifier circuit is applied to the flip-flop, the data sampling is fast, and the energy consumption is low. Moreover, using the optimized latch of the present disclosure can reduce the number of charge/discharge nodes, and further reduce the energy consumption and improve the efficiency.

The invention claimed is:

1. A sense amplifier circuit, comprising:
a charge module, configured to charge a set signal node and a reset signal node according to a clock signal; and
a sense module, coupled to the charge module and configured to sense and amplify a differential input signal according to the clock signal; wherein, the sense module comprises a first amplification circuit, a second amplification circuit, and a cross hopping transfer circuit cross-connected between the first amplification circuit and the second amplification circuit; the cross hopping transfer circuit comprises a first transfer circuit and a second transfer circuit; the first transfer circuit is configured to transfer a valid signal of the second amplification circuit to the first amplification circuit when sensing is completed and first hopping of the differential input signal occurs, such that a set signal of the set signal node and a reset signal of the reset signal node remain unchanged; and the second transfer circuit is configured to transfer a valid signal of the first amplification circuit to the second amplification circuit when the sensing is completed and second hopping of the differential input signal occurs, such that the set signal of the set signal node and the reset signal of the reset signal node remain unchanged.

2. The sense amplifier circuit according to claim 1, wherein
the first amplification circuit comprises a first input signal amplification circuit and a first clock signal sense amplification circuit connected in series; the second amplification circuit comprises a second input signal amplification circuit and a second clock signal sense amplification circuit connected in series; the second clock signal sense amplification circuit is connected to the first input signal amplification circuit through the first transfer circuit; and the first clock signal sense amplification circuit is connected to the second input signal amplification circuit through the second transfer circuit.

3. The sense amplifier circuit according to claim 2, wherein
the first transfer circuit is connected in parallel to the first input signal amplification circuit, a first terminal of the first transfer circuit and a first terminal of the first input signal amplification circuit are both connected to the set signal node, a second terminal of the first transfer circuit and a second terminal of the first input signal amplification circuit are both connected to a first terminal of the first clock signal sense amplification circuit, and a control terminal of the first transfer circuit is connected to a second terminal of the second clock signal sense amplification circuit; and the second transfer circuit is connected in parallel to the second input signal amplification circuit, a first terminal of the second transfer circuit and a first terminal of the second input signal amplification circuit are both connected to the reset signal node, a second terminal of the second transfer circuit and a second terminal of the second input signal amplification circuit are both connected to a first terminal of the second clock signal sense amplification circuit, and a control terminal of the second transfer circuit is connected to a second terminal of the first clock signal sense amplification circuit.

4. The sense amplifier circuit according to claim 1, wherein
the differential input signal comprises an original data signal and an inverted data signal; the first amplification circuit is configured to receive the original data signal, and is turned on in a sensing stage for pulling the set signal down to a low level through a first pull-down path; and the second amplification circuit is configured to receive the inverted data signal, and is turned on in the sensing stage for pulling the reset signal down to a low level through a second pull-down path.

5. The sense amplifier circuit according to claim 2, wherein
the first amplification circuit further comprises a first ground amplification circuit; wherein, the first input signal amplification circuit, the first clock signal sense amplification circuit, and the first ground amplification circuit are sequentially connected in series, a first terminal of the first input signal amplification circuit is connected to the set signal node, a second terminal of the first ground amplification circuit is grounded, and a control terminal of the first ground amplification circuit is connected to the reset signal node and turned on or turned off under an action of the reset signal; and the second amplification circuit further comprises a second ground amplification circuit; wherein, the second input signal amplification circuit, the second clock signal sense amplification circuit, and the second ground amplification circuit are sequentially connected in series, a first terminal of the second input signal amplification circuit is connected to the reset signal node, a second terminal of the second ground amplification circuit is grounded, and a control terminal of the second ground amplification circuit is connected to the set signal node and turned on or turned off under an action of the set signal.

6. The sense amplifier circuit according to claim 1, wherein
the charge module comprises a first charge circuit configured to charge the set signal node according to the clock signal, and a second charge circuit configured to charge the reset signal node according to the clock signal; wherein, a first terminal of the first charge circuit and a first terminal of the second charge circuit are both connected to a power supply, a second terminal of the first charge circuit and the sense module are connected through the set signal node, and a second terminal of the second charge circuit and the sense module are connected through the reset signal node.

7. The sense amplifier circuit according to claim 6, wherein
the charge module further comprises: a first signal maintenance circuit connected in parallel to the first charge circuit, connected to the reset signal node, and configured to maintain a state of the set signal when the sensing is completed and the second hopping of the differential input signal occurs; and a second signal maintenance circuit connected in parallel to the second charge circuit, connected to the set signal node, and configured to maintain a state of the reset signal when the sensing is completed and the first hopping of the differential input signal occurs.

8. The sense amplifier circuit according to claim 7, wherein
the first charge circuit comprises a first switch unit, and the first signal maintenance circuit comprises a second switch unit; wherein, the first switch unit is connected in parallel to the second switch unit; the first switch unit is provided with a first terminal connected to the power supply, a second terminal connected to the set signal node, and a control terminal configured to receive the clock signal; and the second switch unit is provided with a first terminal connected to the power supply, a second terminal connected to the set signal node, and a control terminal configured to receive the reset signal of the reset signal node; and the second charge circuit comprises a fourth switch unit, and the second signal maintenance circuit comprises a third switch unit; wherein, the third switch unit is connected in parallel to the fourth switch unit; the third switch unit is provided with a first terminal connected to the power supply, a second terminal connected to the set signal node, and a control terminal configured to receive the set signal of the set signal node; and the fourth switch unit is provided with a first terminal connected to the power supply, a second terminal connected to the set signal node, and a control terminal configured to receive the clock signal.

9. The sense amplifier circuit according to claim 5, wherein
the first input signal amplification circuit comprises a first switch device, and the first transfer circuit comprises a seventh switch device; wherein, a first terminal of the first switch device and a first terminal of the seventh switch device are both connected to the set signal node, a second terminal of the first switch device and a second terminal of the seventh switch device are both connected to a first terminal of the first clock signal sense amplification circuit, and a control terminal of the seventh switch device is connected to a second terminal of the second clock signal sense amplification circuit; and the second input signal amplification circuit comprises a second switch device, and the second transfer circuit comprises an eighth switch device; wherein, a first terminal of the second switch device and a first terminal of the eighth switch device are both connected to the reset signal node, a second terminal of the second switch device and a second terminal of the eighth switch device are both connected to a first terminal of the second clock signal sense amplification circuit, a control terminal of the eighth switch device is connected to a second terminal of the first clock signal sense amplification circuit, a control terminal of the first switch device is configured to receive an original data signal, and a control terminal of the second switch device is configured to receive an inverted data signal.

10. The sense amplifier circuit according to claim 9, wherein
the first clock signal sense amplification circuit comprises a third switch device, provided with a first terminal connected to a second terminal of the first switch device, a second terminal connected to a first terminal of the first ground amplification circuit, and a control terminal configured to receive the clock signal; and the second clock signal sense amplification circuit comprises a fourth switch device, provided with a first terminal connected to a second terminal of the second switch device, a second terminal connected to a first terminal of the second ground amplification circuit, and a control terminal configured to receive the clock signal.

11. The sense amplifier circuit according to claim 10, wherein
the first ground amplification circuit comprises a fifth switch device, provided with a first terminal connected to a second terminal of the third switch device, a second terminal grounded, and a control terminal configured to receive the reset signal of the reset signal node; and the second ground amplification circuit comprises a sixth switch device, provided with a first terminal connected to a second terminal of the fourth switch device, a second terminal grounded, and a control terminal configured to receive the set signal of the set signal node.

12. A flip-flop, comprising:
the sense amplifier circuit according to claim 1; and a latch configured to receive the clock signal, the differential input signal, and the set signal from the sense amplifier circuit and latch a target data signal.

13. The flip-flop according to claim 12, wherein
the latch comprises: a charge/discharge circuit configured to receive the clock signal, the differential input signal, and the set signal, and output the target data signal; and a feedback circuit configured to receive the target data signal and the clock signal, and latch the target data signal when the clock signal is invalid.

14. The flip-flop according to claim 13, wherein
the charge/discharge circuit comprises a fifth switch unit, a ninth switch device, a tenth switch device, and an eleventh switch device sequentially connected in series; wherein, the fifth switch unit is provided with a first terminal connected to a power supply, a second terminal connected to a first terminal of the ninth switch device, and a control terminal configured to receive the set signal; the differential input signal comprises an original data signal and an inverted data signal; the ninth switch device is provided with a control terminal configured to receive the inverted data signal and a second terminal connected to a first terminal of the tenth switch device; the tenth switch device is provided with a control terminal configured to receive the clock signal and a second terminal connected to a first terminal of the eleventh switch device; the eleventh switch device is provided with a second terminal grounded and a control terminal configured to receive the set signal; the second terminal of the fifth switch unit is configured to output the target data signal; and the fifth switch unit and the eleventh switch device are configured such that at most one of both is turned on at a same time.

15. The flip-flop according to claim 14, wherein the feedback circuit comprises a sixth switch unit, a seventh switch unit, a twelfth switch device, and an inverter sequentially connected in series; the sixth switch unit is provided with a first terminal connected to the power supply and a second terminal connected to a first terminal of the seventh switch unit; the inverter is provided with an input terminal for receiving the target data signal and an output terminal connected to a control terminal of the sixth switch unit; the seventh switch unit is provided with a second terminal connected to a first terminal of the twelfth switch device and a control terminal configured to receive the clock signal; the twelfth switch device is provided with a second terminal connected to a second terminal of the tenth switch device and a control terminal connected to an output terminal of the inverter; and the sixth switch unit and the twelfth switch device are configured such that at most one of both is turned on at a same time.

\* \* \* \* \*